US006343953B2

(12) United States Patent
Nakamura et al.

(10) Patent No.: US 6,343,953 B2
(45) Date of Patent: Feb. 5, 2002

(54) STRUCTURE FOR ASSEMBLING A HOUSING AND A CONNECTOR

(75) Inventors: Mitsuharu Nakamura; Takao Murakami, both of Shizuoka (JP)

(73) Assignee: Yazaki Coproation, Tokyo (JP)

( * ) Notice: Subject to any disclaimer, the term of this patent is extended or adjusted under 35 U.S.C. 154(b) by 0 days.

(21) Appl. No.: 09/811,570

(22) Filed: Mar. 20, 2001

(30) Foreign Application Priority Data

Mar. 21, 2000 (JP) ........................................ 2000-078010

(51) Int. Cl.[7] ........................ H01K 13/40; H01K 12/00; H01K 13/74; H05K 1/00; H02B 1/01

(52) U.S. Cl. ........................ 439/589; 439/76.1; 439/559

(58) Field of Search ................................ 439/587, 589, 439/176, 271, 660, 76.1, 79, 361, 559, 556, 954

(56) References Cited

U.S. PATENT DOCUMENTS

| | | | | | |
|---|---|---|---|---|---|
| 2,761,111 A | * | 8/1956 | Klostermann | 339/91 |
| 3,517,373 A | * | 6/1970 | Jamon | 339/94 |
| 3,956,575 A | * | 5/1976 | Sutherland | 174/87 |
| 4,142,769 A | * | 3/1979 | Wood | 339/88 |
| 4,291,932 A | * | 9/1981 | Cox | 339/60 |
| 4,611,872 A | * | 9/1986 | Ito et al. | 339/94 |
| 4,643,506 A | * | 2/1987 | Kobler | 339/94 |
| 4,676,575 A | * | 6/1987 | Denlinger et al. | 439/271 |
| 4,828,509 A | * | 5/1989 | Vogel | 439/178 |
| 5,158,479 A | * | 10/1992 | Mouissie | 439/589 |
| 5,286,220 A | * | 2/1994 | Watson | 439/589 |
| 5,295,869 A | * | 3/1994 | Siemon et al. | 439/620 |
| 5,752,852 A | * | 5/1998 | Onoda | 439/559 |
| 5,897,395 A | * | 4/1999 | Arnett | 439/536 |
| 5,934,913 A | * | 8/1999 | Kodama | 439/76.1 |
| 5,957,715 A | * | 9/1999 | Fukuda | 439/271 |
| 5,993,233 A | * | 11/1999 | Fukuda | 439/271 |
| 6,039,592 A | * | 3/2000 | Shinchi | 439/271 |
| 6,280,205 B1 | * | 8/2001 | Murowaki et al. | 439/79 |

FOREIGN PATENT DOCUMENTS

JP 10-172643 6/1998

OTHER PUBLICATIONS

Patent Abstracts of Japan. 10–172643. Jun. 26, 1998.

* cited by examiner

*Primary Examiner*—P. Austin Bradley
*Assistant Examiner*—Edwin A. Léon
(74) *Attorney, Agent, or Firm*—Sughrue Mion, PLLC

(57) ABSTRACT

In a structure for assembling a housing and a connector in which a connector is inserted into a housing, and a fitting surface of the connector adapted to be connected to a mating connector and oriented in a direction perpendicular to an inserting direction projects outside the housing through an opening formed in the housing, an inclined wall which is inclined with respect to the inserting direction of the connector is provided on an inner surface of the housing, an annular inclined flange which opposes to the inclined wall is provided on an outer peripheral side of the fitting surface of the connector, a seal member is interposed between the inclined wall and the inclined flange, the seal member is pressed between the inclined wall and the inclined flange by fixing a substrate provided with the connector to the housing.

2 Claims, 2 Drawing Sheets

STRUCTURE FOR ASSEMBLING A HOUSING AND A CONNECTOR

BACKGROUND OF THE INVENTION

1. Field of the Invention

The present invention relates to an assembling structure which ensures the waterproofness of a housing and a connector in such as an electronic control unit (ECU) for automobile use, for example.

The present application is based on Japanese Patent Application No. 2000-78010, which is incorporated herein by reference.

2. Description of the Related Art

FIG. 3 is a cross-sectional view illustrating a conventional structure for assembling a housing and a connector disclosed in unexamined Japanese Patent Publication No. JPA-10-172643.

In this assembling structure, when a connector 2 is assembled to a housing 1, a projection 3 of the connector 2 is inserted in an opening 5 of the housing 1 in a state in which an annular seal member 4 is fitted around an outer periphery of the projection 3 on the connector 2 side. In this state, as the connector 2 is screwed to the housing 1, the gap between the housing 1 and the connector 2 is sealed by the seal member 4.

However, with the above-described conventional assembling structure, when the projection 3 of the connector 2 is inserted into the housing 1, there is a possibility that an end of the opening of the housing 1 can rub against the seal member 4 or is caught by the same. Accordingly, there has been the risk that the seal member 4 becomes damaged or dislocated, and the reliability of the seal declines. Further, since the pressing force of the seal member 4 with respect to the housing 1 and the connector 2 is mainly dependent upon the dimensions of the outer periphery of the projection 3 of the connector 2, the variation of the sealing performance has been large.

In view of the above-described circumstances, an object of the invention is to provide a structure for assembling a housing and a connector which has small variations and is capable of maintaining high sealing performance without causing damage to the seal member and without the occurrence of dislocation.

SUMMARY OF THE INVENTION

In the present invention, there is provided a structure for assembling a housing and a connector in which a connector is inserted into an interior of a housing, and a fitting surface of the connector adapted to be connected to a mating connector and oriented in a direction perpendicular to an inserting direction projects outside the housing through an opening formed in the housing, characterized in that an inclined wall which is inclined with respect to the inserting direction of the connector is provided on an inner surface of the housing, that an annular inclined flange which opposes the inclined wall when the connector is assembled to the housing is provided on an outer peripheral side of the fitting surface of the connector, that a seal member continuing along a periphery of the opening is interposed between the inclined wall and the inclined flange, and that the seal member can be freely pressed between the inclined wall and the inclined flange by pressing the connector in the inserting direction and fixing the connector to the housing.

In this assembling structure, when the connector is inserted into the interior of the housing along a fixed inserting direction, the inclined flange of the connector approaches the inclined wall on the inner surface of the housing, and the seal member is clamped between the inclined wall and the inclined flange. Then, as the connector is fixed to the housing while being pressed in the inserting direction, the inclined wall and the inclined flange are opposed to each other with a fixed interval therebetween, with the result that the seal member is clamped between the inclined wall and the inclined flange with a fixed force.

In this state, the fitting surface of the connector which is oriented in the direction perpendicular to the inserting direction projects outside the housing through the opening provided in the inclined wall of the housing, so that the mating connector can be fitted to the fitting surface. Moreover, since the seal member which continues along the periphery of the opening is present around the opening in the state of being clamped between the inclined wall and inclined flange, the gap between the connector and the housing is sealed by this seal member, so that the interior of the housing is maintained as a waterproof space.

In this case, since the inclined wall and the inclined flange approach each other and clamp the seal member by their opposing surfaces by moving the connector in the inserting direction, it is possible to prevent the seal member from being rubbed or caught by the end of the opening of the housing as experienced with the conventional assembling structure, so that it is possible to prevent the seal member from becoming damaged or dislocated. In addition, since pressure contact force is applied to the seal member by the face-to-face approach, the seal surface can be stably held by the fastening force of the screws at the time of fixing the connector to the housing. Accordingly, it is possible to demonstrate highly reliably sealing performance which is free of variations.

Additionally in the present invention, the above structure for assembling a housing and a connector is further characterized in that the connector is fixed to a substrate extending in a direction of a plane perpendicular to the connector inserting direction, and the seal member can be freely pressed between the inclined wall and the inclined flange through a fastening operation at a time when the substrate is fastened to the housing by screws.

With this assembling structure, by merely effecting the usual operation of fixing the substrate with the connector mounted thereon to the housing, the connector can be assembled to the housing while maintaining predetermined sealing performance.

DETAIL DESCRIPTION OF THE PREFERRED EMBODIMENTS

Hereafter, a description will be given of an embodiment of the invention with reference to the drawings.

Figure 1:
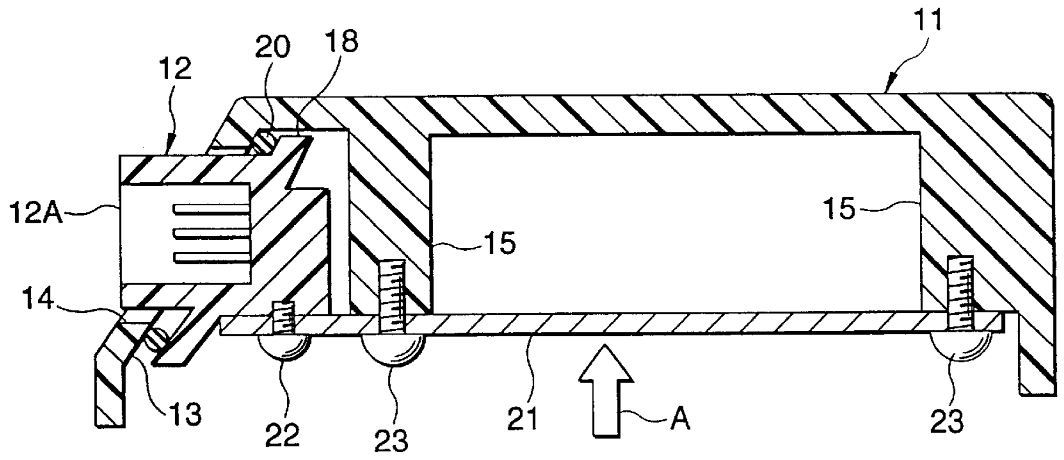
FIG. 1 is a cross-sectional view of an embodiment of the invention.
Figure 2:
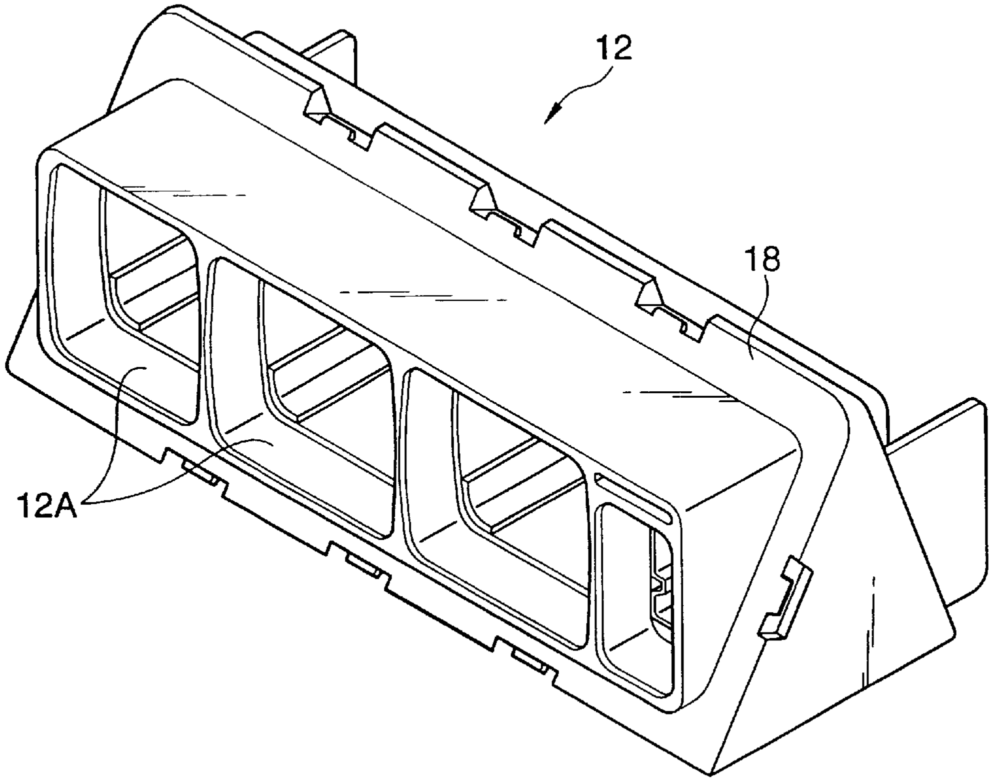
FIG. 2 is a perspective view of a connector in accordance with the embodiment of the invention.
Figure 3:
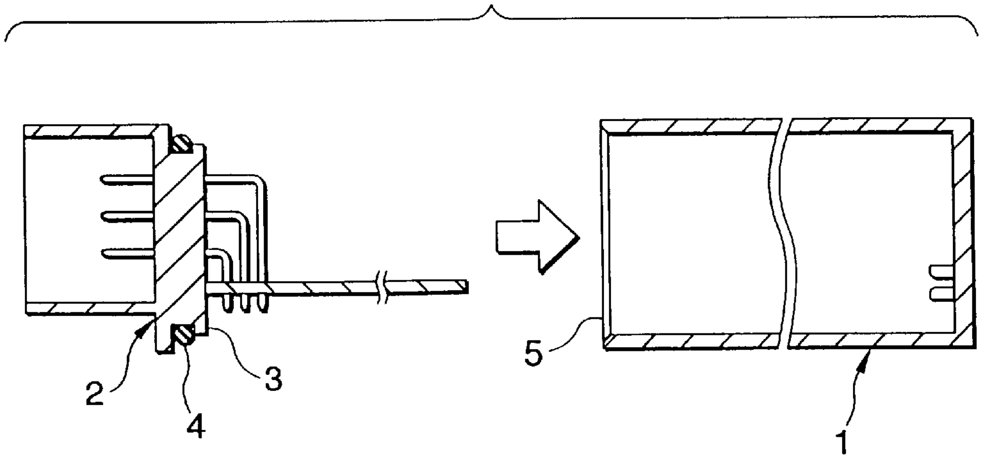
FIG. 3 PRIOR ART
FIG. 3 is a cross-sectional view illustrating an example of a conventional structure for assembling a housing and a connector.

FIG. 1 is a cross-sectional view illustrating a structure for assembling a housing and a connector in accordance with an embodiment of the invention, and FIG. 2 is a perspective view illustrating only the external appearance of the connector.

In the drawings, reference numeral 11 denotes a housing made of a synthetic resin, 12 denotes a connector made of a synthetic resin, and 21 denotes a substrate. The connector 12 is fixed to an upper surface of an end portion of the substrate 21 by screws 22. The housing 11 is a box-shaped housing whose lower surface is open and the other surfaces are covered with walls, and the substrate 21 with the connector 12 fixed thereto is inserted along an inserting direction A directed from the lower side toward the upper side, so as to be assembled.

The connector 12 is mounted on the substrate 21 in a state in which its fitting surface 12A for fitting to a mating connector is oriented in a direction perpendicular to the inserting direction A. As the substrate 21 is moved into the housing 11 along the inserting direction A while maintaining its attitude parallel to a plane perpendicular to the inserting direction A, the substrate 21 can be fixed to lower faces of boss portions 15 provided in such a manner as to project downward from a ceiling surface of the housing 11 by using screws 23.

An inclined wall 13 which is inclined with respect to the inserting direction A of the connector 12 is provided on an inner surface of the housing 11, and an opening 14 for causing the fitting surface 12A of the connector 12 to project outside the housing 11 is formed in the inclined wall 13. In addition, as shown in FIG. 2, an annular inclined flange 18 which opposes the aforementioned inclined wall 13 when the connector 12 is assembled to the housing 11 is provided in the connector 12 by being positioned on the outer peripheral side of the fitting surface 12A with respect to the mating connector.

A seal member 20 which continues along the periphery of the opening 14 is interposed between the inclined wall 13 and the inclined flange 18. As the substrate 21 with the connector 12 fixed thereto is pressed in the inserting direction A and is fixed to the lower faces of the boss portions 15 of the housing 11 by means of the screws 23, the seal member 20 is clamped in a state of being pressed between the inclined wall 13 and the inclined flange 18. In this case, through the fastening operation at the time when the substrate 21 is fastened to the housing 11 by the screws 23, the seal member 20 is clamped between the inclined wall 13 and the inclined flange 18 in a state of being compressed by a certain degree.

To construct this assembled structure, the substrate 21 with the connector 12 mounted thereon is inserted into the interior of the housing 11 along the fixed inserting direction A. Then, the inclined flange 18 of the connector 12 approaches the inclined wall 13 on the inner surface of the housing 11, and the seal member 20 which has been set in advance between the inclined wall 13 and the inclined flange 18 is clamped between the inclined wall 13 and the inclined flange 18. Then, as the substrate 21 is fixed to the lower faces of the boss portions 15 of the housing 11 by the screws 23, the inclined wall 13 and the inclined flange 18 are opposed to each other with a fixed interval therebetween, with the result that the seal member 20 is clamped between the inclined wall 13 and the inclined flange 18 in a state of being pressed by a certain degree.

In this state, the fitting surface 12A of the connector which is oriented in the direction perpendicular to the inserting direction A projects outside the housing 11 through the opening 14 provided in the inclined wall 13 of the housing 11, so that the mating connector can be fitted to the fitting surface 12A.

Moreover, since the seal member 20 is present around the opening 14 in the state of being clamped between the inclined wall 13 and inclined flange 18, the gap between the connector 12 and the housing 11 is sealed by this seal member 20, so that the interior of the housing 11 is maintained as a waterproof space.

In this case, since the inclined wall 13 and the inclined flange 18 approach each other and clamp the seal member 20 by their opposing surfaces by merely effecting the usual operation of fixing the substrate 21 with the connector 12 mounted thereon to the housing 11 from a fixed direction, it is possible to prevent the seal member 20 from being rubbed or caught, so that it is possible to prevent the seal member 20 from becoming damaged or dislocated. In addition, since pressure contact force is applied to the seal member 20 by the face-to-face approach of the inclined wall 13 and the inclined flange 18, the seal surface can be stably held by the fastening force of the screws 23 at the time of fixing the connector 12 to the housing 11. Accordingly, it is possible to demonstrate highly of reliably sealing performance which is free of variations.

As described above, in accordance with the invention according to claim 1, since the inclined wall of the housing and the inclined flange of the connector clamp the seal member by their opposing surfaces, it is possible to prevent the seal member from being rubbed or caught as experienced with the conventional assembling structure, so that it is possible to prevent the seal member from becoming damaged or dislocated. In addition, since pressure contact force is applied to the seal member by the face-to-face approach, the seal surface can be stably held, and it is possible to demonstrate highly reliably sealing performance which is free of variations.

In accordance with the second invention, by merely effecting the usual operation of fixing the substrate with the connector mounted thereon to the housing, the connector can be assembled to the housing simply while maintaining high sealing performance.

What is claimed is:

1. A connector structure comprising:

a housing provided with an opening and an inclined wall formed on an inner surface of said housing with an inclination to an inserting direction of a connector;

said connector having a fitting surface to a mate connector, oriented in a direction perpendicular to said inserting direction, projecting outside said housing through said opening of said housing, and an annular inclined flange provided on an outer peripheral side of said fitting surface of said connector and opposing to said inclined wall; and a seal member provided along a periphery of said opening of said housing and interposed between said inclined wall and said inclined flange;

wherein said seal member is pressed between said inclined wall and said inclined flange by pressing said connector in the inserting direction and fixing said connector to said housing.

2. A connector structure according to claim 1 further comprising, a substrate supporting said connector and extending in a direction of a plane perpendicular to the connector inserting direction, wherein said seal member is pressed between said inclined wall and said inclined flange through a fastening operation between said substrate and said housing.

* * * * *